United States Patent
Ebergen et al.

(12)

(10) Patent No.: US 6,707,317 B2
(45) Date of Patent: Mar. 16, 2004

(54) METHOD AND APPARATUS FOR ASYNCHRONOUSLY CONTROLLING DOMINO LOGIC GATES

(75) Inventors: Josephus C. Ebergen, San Francisco, CA (US); Ivan E. Sutherland, Santa Monica, CA (US); Jon Lexau, Beaverton, OR (US); Jonathan Gainsley, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 52 days.

(21) Appl. No.: 10/135,166

(22) Filed: Apr. 29, 2002

(65) Prior Publication Data

US 2003/0201796 A1 Oct. 30, 2003

(51) Int. Cl.[7] .............................................. H03K 19/096
(52) U.S. Cl. .............................. 326/95; 326/83; 326/112
(58) Field of Search .............................. 326/93, 95, 98, 326/112, 119, 121, 82, 83

(56) References Cited

U.S. PATENT DOCUMENTS 6,356,117 B1 * 3/2002 Sutherland et al. ............ 326/93
6,590,424 B2 * 7/2003 Singh et al. .................... 326/93

* cited by examiner

*Primary Examiner*—Daniel Chang
(74) *Attorney, Agent, or Firm*—Park, Vaughan & Fleming LLP (57) ABSTRACT

One embodiment of the present invention provides a domino logic circuit that operates asynchronously. This domino logic circuit includes a number of stages, including a present stage that receives one or more inputs from a prior stage and generates one or more outputs for a next stage. It also includes a control circuit that ensures that the present stage enters a precharging state before entering a subsequent evaluation state in which one or more inputs of the present stage are used to generate one or more outputs. This control circuit receives a prior control signal from the prior stage and sends a present control signal to the next stage

20 Claims, 8 Drawing Sheets

——— = FULL/ACTIVE   - - - - - - = EMPTY/INACTIVE   |- - - -|
                                                   |———|  = 1 GATE DELAY

```
P0 & P1
where
    P0 = (m0 -> m1 -> m2 -> P0)
    P1 = (m1 -> m2 -> m3 -> P1)
end
```

```
EVAL =  eval AND  preC
HOLD = ~eval AND  preC
PRE  = ~eval AND ~preC
```

```
C0 & S0 & S1 & S2 & C1
where
   C0 = (n0 -> m0 -> C0)
   S0 = (m0 -> m1 -> m2 -> S0)
   S1 = (m1 -> m2 -> m3 -> S1)
   S2 = (m2 -> m3 -> m4 -> S2)
   C1 = (m4 -> n1 -> C1)
end
```

METHOD AND APPARATUS FOR ASYNCHRONOUSLY CONTROLLING DOMINO LOGIC GATES

BACKGROUND

1. Field of the Invention

The present invention relates to the design of digital circuits that operate asynchronously. More specifically, the present invention relates to a method and an apparatus for asynchronously controlling domino logic circuits.

2. Related Art

Domino logic circuits are becoming increasingly popular because they provide reduced input capacitance and low switching thresholds, which results in increased speed. Moreover, the use of domino logic leads to simple, area-efficient circuit layouts, which save space on a semiconductor die.

Figure 1A:
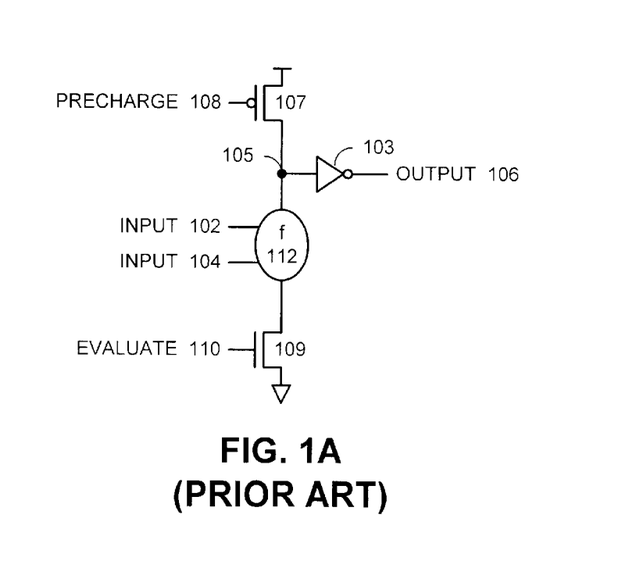
FIG. 1A illustrates a domino logic stage.

Referring to FIG. 1A, a domino logic circuit operates by first entering a precharging state that precharges an interior node 105 to a high voltage. This precharging operation is accomplished by using P-type transistor 107 to pull interior node 105 to a high voltage. Note that this precharging operation sets the output 106 of inverter 103 to a low voltage. During a subsequent evaluation state, interior node 105 either switches from the high voltage to a low voltage, or remains at the high voltage depending upon the inputs 102 and 104 and the function implemented by transistors in functional circuitry 112.

When interior node 105 falls during the evaluation state, it causes the output 106 of inverter 103 to change, which can cause outputs of a chain of downstream domino logic stages to change in the same way as a chain of dominos falls.

In a synchronous system, it is a relatively simple matter to synchronize the precharging and evaluation operations with different phases of a system clock signal. However, in an asynchronous system, which does not operate with reference to a system clock, coordinating the precharging and evaluation operations can be considerably more challenging.

Note that although asynchronous circuits provide a number of design challenges, asynchronous circuits are free from having to continually synchronize with a system clock signal. This allows asynchronous circuits to run at significantly higher speeds.

Hence, what is needed is a method and an apparatus for controlling the sequencing of precharging and evaluation operations for a domino logic circuit in an asynchronous manner without having to refer to a system clock signal.

SUMMARY

One embodiment of the present invention provides a domino logic circuit that operates asynchronously. This domino logic circuit includes a number of stages, including a present stage that receives one or more inputs from a prior stage and generates one or more outputs for a next stage. It also includes a control circuit that ensures that the present stage enters a precharging state before entering a subsequent evaluation state in which one or more inputs of the present stage are used to generate one or more outputs. This control circuit receives a prior control signal from the prior stage and sends a present control signal to the next stage.

In a variation on this embodiment, the prior control signal indicates that the prior stage is in an evaluation state in which the prior stage generates at least one output for the present stage. Upon receiving the prior control signal, the control circuit for the present stage is configured to set a present control signal so that domino logic within the present stage enters the evaluation state. This causes domino logic within the present stage to evaluate at least one input received from the prior stage to produce at least one output for the next stage. The control circuit also resets the prior control signal, so that domino logic within the prior stage returns to a precharging state. In this way, domino logic within the prior stage precharges before entering a subsequent evaluation state.

In a variation on this embodiment, if at least two stages follow the present stage, the present stage is configured to wait to enter the evaluation state until a feedback signal is received from a stage following the next stage. This feedback signal indicates that the stage following the next stage has entered an evaluation state, which causes the next stage to enter the precharging state. In this way, the next stage precharges before entering a subsequent evaluation state.

In a variation on this embodiment, a keeper circuit is configured to maintain an existing value on an output of the present stage while the present stage enters the evaluation state.

In a variation on this embodiment, domino logic circuitry for the present stage includes: a pulldown transistor for pulling an internal node of the present stage to a low voltage during the evaluation state; and a pullup transistor for pulling the internal node of the present stage to a precharge voltage during the precharging state.

In a variation on this embodiment, the control circuit for the present stage is implemented using a GasP module. This GasP module fires when all its inputs are set. Upon firing, the GasP module sets all of its outputs and resets all of its inputs. (The design of a GasP module is described in more detail below with reference to FIGS. 6–8D.)

In a variation on this embodiment, a first stage receives one or more inputs from circuitry that does not contain domino logic. In this variation, a control circuit for the first stage causes the first stage to automatically leave the evaluation state after a fixed period of time to enter a hold state. During this hold state, inputs to the first stage cannot corrupt data within domino logic in the first stage.

In a variation on this embodiment, the cycle time between successive evaluation states is six gate delays.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Domino Gates

Figure 1B:
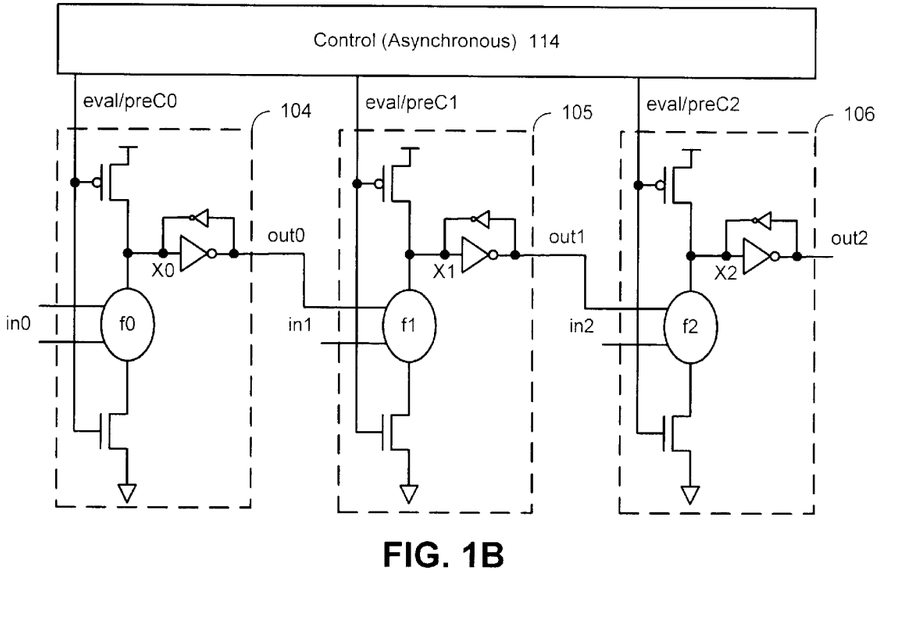
FIG. 1B illustrates a series of domino logic stages in accordance with an embodiment of the present invention.

Consider the pipeline of three domino gates illustrated in FIG. 1. Each domino gate has a stack of pull-down transistors representing the function implemented by the domino gate, a pull-up and pull-down transistor connected to the control wire eval/preC, and an inverter with a weak feedback inverter to hold the current value. The control wire eval/preC controls when the domino gate evaluates the next function value and when the domino gate is precharging its nodes. When eval/preC is LO, the pull-up transistor precharges the internal node X to HI and eventually the output node goes LO. When eval/preC is HI, the pull-down stack pulls the internal node LO, if the function evaluates to TRUE for the current input values. Otherwise, the internal node remains HI. If during evaluation the pull-down stack pulls down the internal node, the output node eventually goes HI.

FIG. 1 shows just a single domino gate controlled by each eval/preC signal. In practice, however, each eval/preC signal controls a set of domino gates.

Domino gates alternate between two states: EVAL, representing evaluate, and PRE, representing precharge. The domino gate is in state EVAL when the control wire eval/preC is HI and in state PRE when the control wire eval/prec is LO. A pipeline of domino gates can compute successive function evaluations by controlling the respective eval/prec control wires in the proper way. Thus, waves of function evaluations and precharges ripple down the pipeline.

There are several sets of rules that guarantee proper operation of an asynchronous domino pipeline. All of these sets of rules adhere to the following principle:

Evaluate and Precharge Principle: At any moment during operation of a domino pipeline between any two domino gates that are part of distinct waves of function evaluations, there must be at least one domino gate in precharge.

Given this description of domino pipelines, the problem is to design an asynchronous control circuit for a pipeline of domino gates. We design such control circuits using so-called "GasP" modules. GasP modules are descried in the last section of this disclosure.

Pipelines and Tokens

In order to design a control circuit for a domino pipeline, we use the following abstract descriptions of a pipeline. A pipeline includes a sequence of stages, where each stage corresponds to a domino gate. A token rippling through the stages of a pipeline represents a function evaluation rippling through the domino gates of a pipeline. The presence of a token in a stage means that the corresponding domino gate is evaluating and the absence of a token means the domino gate is precharging. In other words, we have the following correspondence between the state of a stage and the state of the domino gate: FULL=EVAL and EMPTY=PRE.

In order to adhere to the Evaluate and Precharge Principle for domino pipelines, we use the following Domino Pipeline Principle.

Domino Pipeline Principle: Every two consecutive stages in a pipeline contain at most one token.

Notice that a consequence of this principle is that between every two full stages, there is at least one empty stage, thus satisfying the Evaluate and Precharge Principle.

Although in general one function evaluation may spread over a number of successive domino stages, in our abstract interpretation we restrict the spread of each function evaluation to just one stage, viz., the stage that contains the token. A precharge may spread over multiple stages, because many successive stages may be empty. Such a pipeline can be referred to as a normally-opaque pipeline.

In contrast to choosing the correspondence FULL=EVAL and EMPTY=PRE, we can choose the correspondence FULL=PRE and EMPTY=EVAL. Then, the rippling of a token down the pipeline corresponds to the rippling down the pipeline of a precharge, where a precharge spreads over a single stage only and function evaluations may spread over multiple stages. Such a pipeline can be referred to as a normally-transparent pipeline. In the following discussion, we use normally-opaque pipelines.

GasP Control

FIG. 2 illustrates how we can satisfy the Domino Pipeline Principle with a network of GasP modules. For the two stages in FIG. 2A we labeled the boundaries with m0, m1, and m2, representing the crossings of the respective boundaries by a token. Because at any time during operation any two consecutive stages may contain at most one item, the sequences of boundary crossings with respect to m0, m1, and m2 must satisfy specification P where P=(m0–>m1–>m2–>P).

Figure 2A:
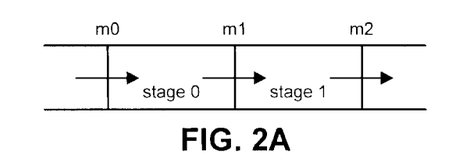
FIG. 2A illustrates data movements between domino logic stages in accordance with an embodiment of the present invention.
Figure 2B:
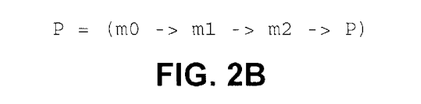
FIG. 2B illustrates a specification for the data movements in accordance with an embodiment of the present invention.
Figure 2C:
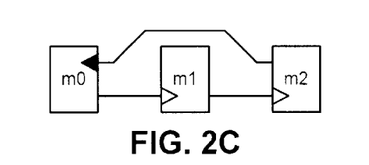
FIG. 2C illustrates GasP circuitry for controlling the data movements in accordance with an embodiment of the present invention.

We assume that initially all stages are empty. The specification stipulates that each token that moves into the first stage must move into the second stage and finally exit the second stage before the next token can enter the first stage. This specification is satisfied by the implementation in FIG. 2C.

Figure 2D:
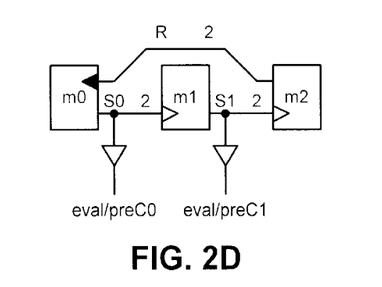
FIG. 2D illustrates GasP circuitry with delay assignments and with drivers for control signals in accordance with an embodiment of the present invention.

In the implementations so far we have refrained from specifying what the delays are between any two successive firings of distinct GasP modules. In 2–4 GasP we can choose a delay assignment of two or four gate delays between the firings. Because we strive for the shortest possible cycle time, we choose a delay of two gate delays for each state wire, which yields a cycle time of six gate delays: the shortest cycle time possible in GasP. FIG. 2D shows the GasP control including the delay assignments.

The state wires S0 and S1 in FIG. 2D indicate whether stage 0 and stage 1, respectively, are full or empty. When state S0 is active, stage 0 is full; when state S0 is inactive, stage 0 is empty. A similar reasoning applies to state S1.

Figure 2E:
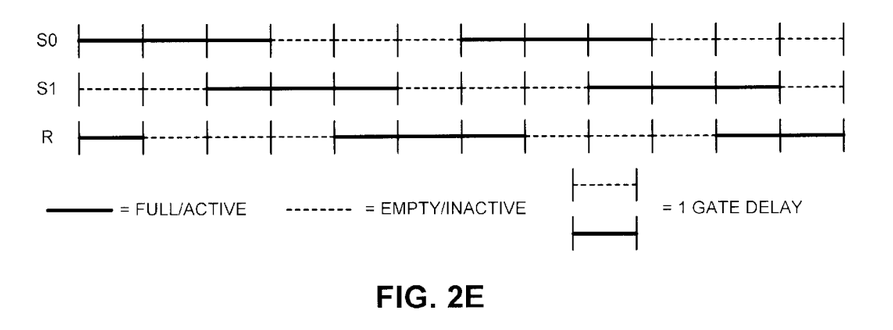
FIG. 2E illustrates a timing diagram for the GasP circuitry in accordance with an embodiment of the present invention.

In a 2–4 GasP implementation each state wire is active, and inactive respectively, for at least three gate delays. FIG. 2E shows how the state of state wires S0 and S1 change between FULL and EMPTY over time and the state of state wire R changes between ACTIVE and INACTIVE, where we assume that each cycle lasts exactly six gate delays.

The timing diagram in FIG. 2E may be confusing. The diagram shows that two successive stages can be in the state FULL for one gate delay, which corresponds to two successive stages containing a token. This seems to contradict our Domino Pipeline Principle. Fortunately, the seeming contradiction is not a real contradiction, but more an artifact of our GasP implementation. The two tokens are in essence the same token; here is why. In 2–4 GasP implementations, state changes occur with a delay of one or two gate delays instead of being instantaneous changes. Furthermore, each state lasts at least three gate delays. As a result there is a small overlap when the delay from one stage to the next is only two gate delays.

Because the state of the state wires S0 and S1 reflects the fullness of the respective stages, we can use these wires to drive the eval/prec signals in correspondence with the principle FULL=EVAL and EMPTY=PRE. FIG. 2D illustrates this principle.

Notice that our implementations refrain from specifying whether a state wire is active HI or active LO. Consequently, when an actual GasP implementation is chosen, the drivers for the eval/preC signals may need an inversion. Because of the drivers, the correspondence FULL=EVAL and EMPTY=PRE is valid only with a fixed offset equal to the delay of a driver. We often call this offset delay the kiting delay.

Finally, we remark that some timing constraints between the GasP control and the domino pipeline must be satisfied for proper operation. These timing constraints are similar to the bundling constraints in a conventional pipeline.

Multiple Stages

Figure 3A:
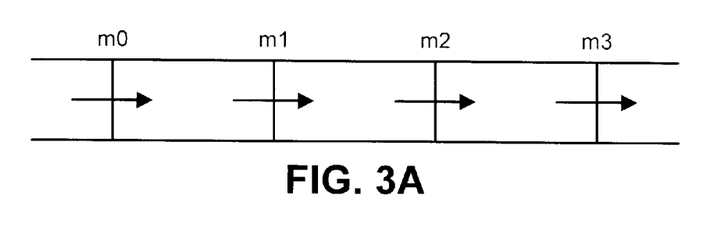
FIG. 3A illustrates data movements between domino logic stages in accordance with another embodiment of the present invention.
Figure 3B:
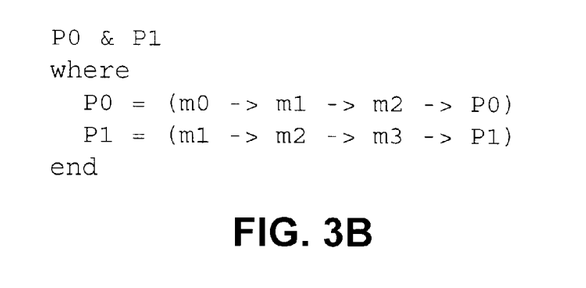
FIG. 3B illustrates a specification for the data movements in accordance with another embodiment of the present invention.

When there are multiple stages in a pipeline, specification P applies to each two consecutive stages. For example, the three stages in FIG. 3A have two pairs of consecutive stages. The first pair obeys specification P0 and the second pair obeys specification P1, where, P0=(m0–>m1–>m2–>P0), and P1=(m1–>m2–>m3–>P1).

Figure 3C:
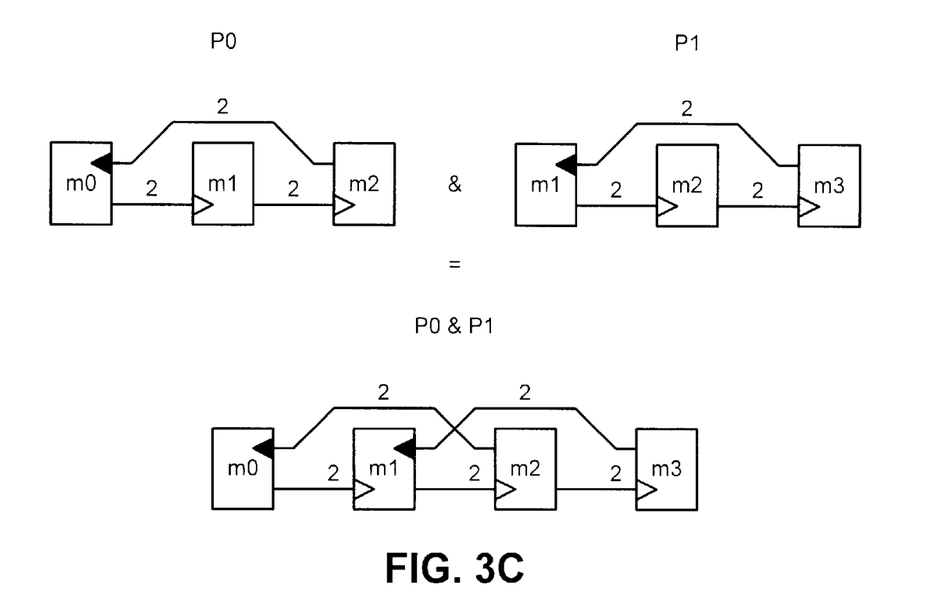
FIG. 3C illustrates GasP circuitry for controlling the data movements in accordance with another embodiment of the present invention.

The AND of specifications P0 and P1 specifies all sequences of moves across stage boundaries satisfying the Domino Pipeline Principle. Formally, the AND of two specifications is the "weave" of the specifications. In GasP networks, the implementation of the AND is simply the superposition of the respective implementations, which gives the implementation in FIG. 3C. This procedure can be applied to any number of consecutive stages.

Three-State Domino Gates

Figure 4A:
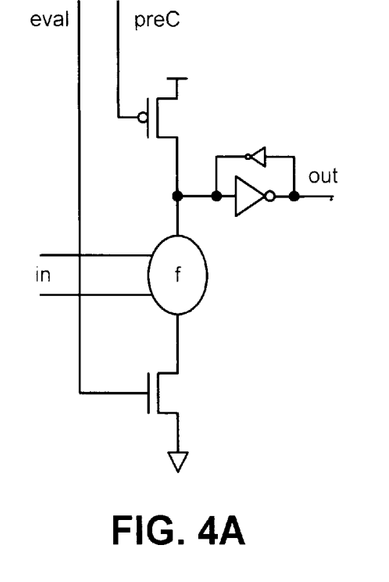
FIG. 4A presents a transistor diagram for a three-state domino gate in accordance with an embodiment of the present invention.

In order to switch conveniently from a conventional data path to a domino data path and back, we introduce a three-state domino gate. FIG. 4A shows a three-state domino gate, which has two control wires instead of one. The control wire labeled eval controls the footer NMOS pull-down transistor and the wire labeled preC controls the PMOS pull-up transistor. We have called this domino gate a three-state domino gate, because it can be in a third state besides EVAL and PRE. In the third state, called HOLD, the domino gate holds the most recent value.

Figure 4B:
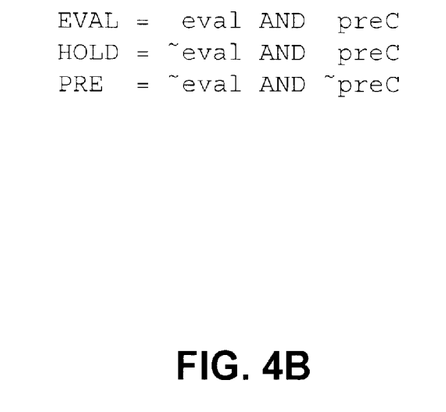
FIG. 4B illustrates state definitions for the three-state domino gate in accordance with an embodiment of the present invention.

FIG. 4B defines the three states of the domino gate with respect to the control wires eval and preC, where "~" denotes negation. In the state EVAL, only the pull-down NMOS transistor is conducting. In the state PRE, only the pull-up PMOS transistor is conducting. In the state HOLD, neither the pull-down NMOS transistor nor the pull-up transistor are conducting; the domino gate "holds" the current value.

The idea is that the three-state domino gate cycles through the states EVAL, HOLD, and PRE in that sequence. The time the domino gate spends in the state HOLD may be zero.

Figure 4C:
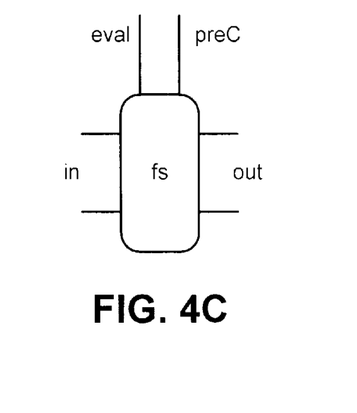
FIG. 4C illustrates a schematic symbol for the three-state domino gate in accordance with an embodiment of the present invention.
Figure 4D:
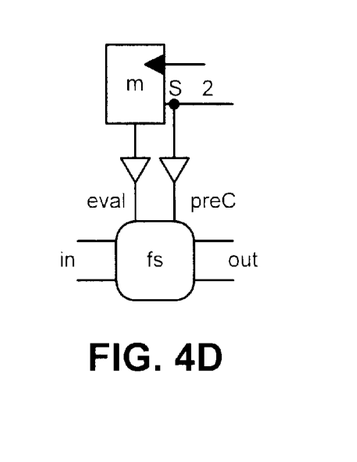
FIG. 4D illustrates a GasP control module for the three-state domino gate in accordance with an embodiment of the present invention.

FIG. 4C shows a schematic for a collection of three-state domino gates controlled by the same eval and preC control wires. FIG. 4D shows how a GasP module can control a collection of three-state domino gates. The state wire that reflects the fullness of the domino stage drives the control wire preC such that the correspondence EMPTY=PRE holds with a fixed offset delay equal to the driver delay. The output of the NAND in the GasP module drives the wire eval. Recall that the output of the NAND in a GasP module produces a falling pulse of three gate delays. The GasP module drives the wire eval with the correspondence that the three-state domino gate is in state EVAL during the first three gate delays that the stage is in state FULL, again with the same fixed offset delay as for the state PRE; the remaining time in state FULL, the domino gate is in state HOLD. In order to satisfy this correspondence an equal-gate-delay model must apply and the right number of inversions must be present between the firing of the GasP module and the signal eval. It is also important to note that in the state change from PRE to EVAL both control wires eval and prec must change simultaneously.

Note that when you connect the wires eval and preC, you obtain a standard domino gate.

From a Non-Domino Data Path to Domino and Back

Now that we know how to design a GasP control for a domino data path, how can we interface the control of a domino data path and the control of a non-domino data path? The solution is simple as long as we stick to the Domino Pipeline Principle for the domino pipelines and a similar principle for non-domino pipelines. The principle for non-domino pipelines says that each stage contains at most one token.

Figure 5A:
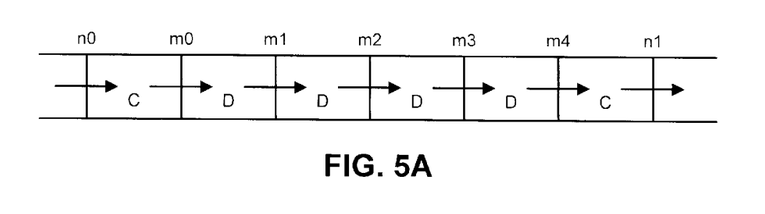
FIG. 5A illustrates data movements between domino logic stages in accordance with yet another embodiment of the present invention.
Figure 5B:
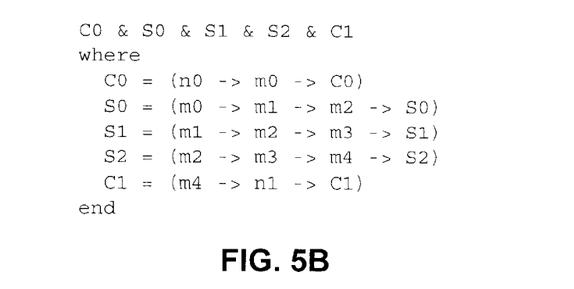
FIG. 5B illustrates a specification for the data movements in accordance with yet another embodiment of the present invention.

FIG. 5A shows the control for a data path that starts with a non-domino stage, then has four domino stages, and ends with a non-domino stage. FIG. 5B shows the specification for all sequences of moves across the stage boundaries that satisfy the pipeline principles. Because the first stage is a non-domino stage, the tokens must move alternately into and out of the first stage, which leads to specification C0. For the four domino stages, each two successive stages may contain at most one token. Because there are three pairs of successive stages, we obtain the three specifications P0, P1, and P2. The final stage is again a non-domino stage specified by C11.

Figure 5C:
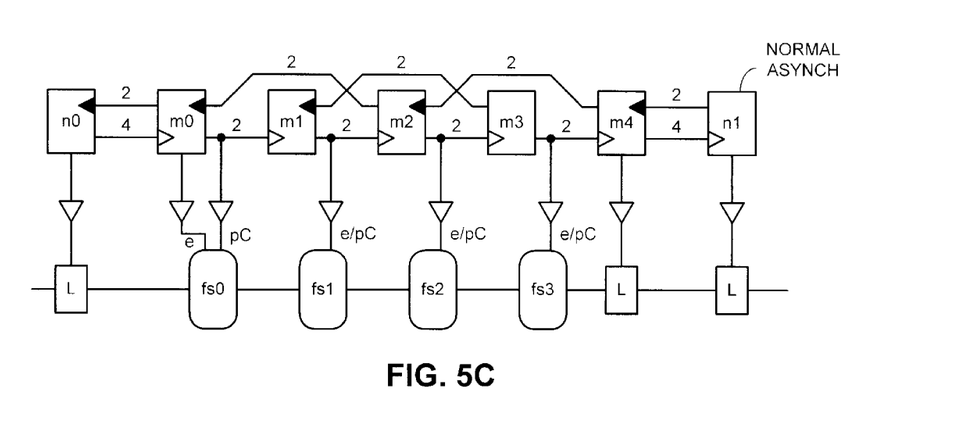
FIG. 5C illustrates GasP circuitry for controlling the data movements in accordance with yet another embodiment of the present invention.

Each of the five specifications has a simple GasP implementation and the AND of these implementations yields the complete implementation in FIG. 5C. As before, we have assigned a delay of two to each state wire in the domino part of the control. In the control for the non-domino stages we have assigned four gate delays to the forward latency and two gate delays to the reverse latency, assuming that tokens move from left to right in FIG. 5C.

The complete implementation operates with a cycle time of six gate delays, because each cycle in the implementation lasts 6 gate delays.

There is one problem when combining a non-domino data path and a domino data path. If the last stage in the non-domino data path and the first stage in the domino data path can contain distinct data items, the data item in the domino stage may be corrupted. The corruption occurs, because the arrival of a new data item in the last stage of the non-domino pipeline will interfere with the function evaluation occurring in the first stage of the domino pipeline. Such a situation can occur, for example, when the domino pipeline blocks a data item in its first stage and a distinct data item arrives in the last stage in the non-domino data path.

In order to prevent data corruption in the first domino stage, we use a three-state domino gate in the first domino stage. For a three-state domino gate the evaluate period coincides with the transparency pulse of a non-domino latch, and is exactly three gate delays. As a consequence, when the pipeline blocks up, the first domino stage can stay full, while new data may arrive in the preceding non-domino stage. Any new data item arriving in the non-domino stage cannot interfere with the data item in the first domino stage, because the data arrives after the end of the transparency pulse and thus the domino gate is no longer in the evaluate state. Instead, the domino gate is in the HOLD state, where it will remain until the pipeline empties. When the first domino stage becomes empty, the domino gate will be precharged for at least three gate delays, and subsequently the domino stage may become full again. Thus, the three-state domino gate safely separates distinct data items in the first domino stage and the last non-domino stage.

Another attractive property of three-state domino gates is that we can use the same delay constraint as with non-domino latches to verify proper operation. The reason, of course, is that the evaluate period of a three-state domino gate exactly coincides with the transparency period of a non-domino latch.

This specification describes a GasP control for a domino pipeline using one simple principle: any two successive domino stages contain at most one token. The same principle can be applied to other domino designs, like branching pipelines, merging pipelines, and finite state machines.

The Domino Pipeline Principle also applies to the design of other types of control circuits, besides GasP control circuits. For example, control circuits using transition signaling can be designed with the Domino Pipeline Principle as well. The resulting circuit is similar to our GasP control, but instead of GasP modules you would get C elements with one inverted input.

GasP Modules

Figure 6A:
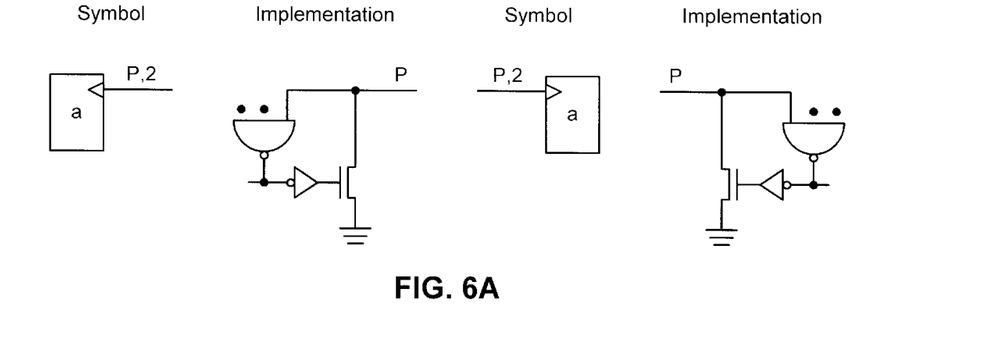
FIG. 6A illustrates a type of terminal connection for a GasP module with a time separation of two gate delays between firings of modules in accordance with an embodiment of the present invention.
Figures 6B, 6C:
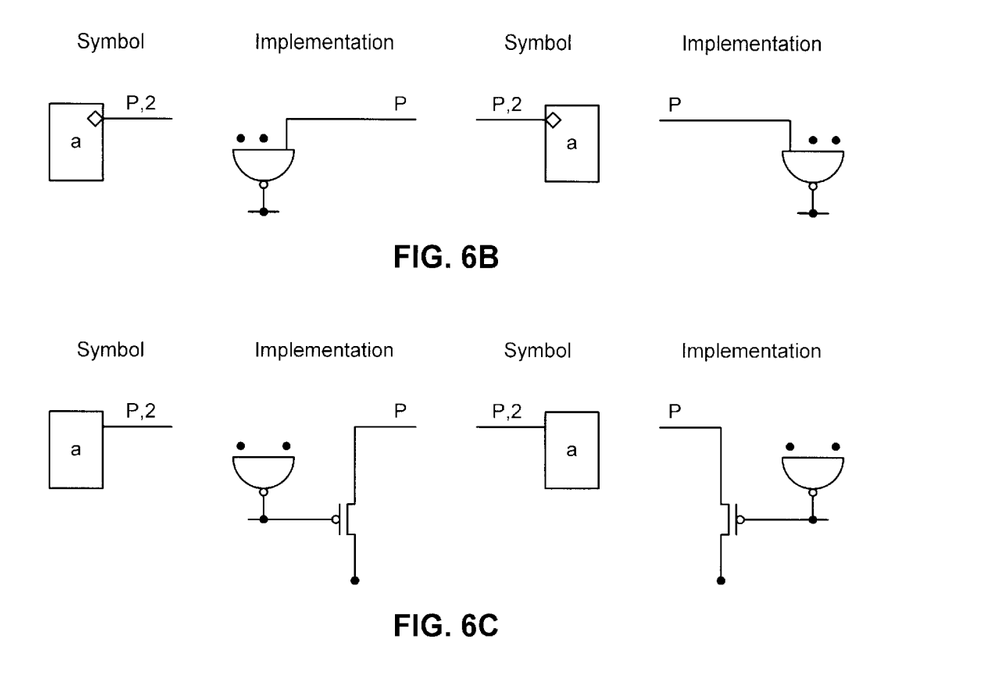
FIG. 6B illustrates another type of terminal connection for a GasP module with a time separation of two gate delays between firings of modules in accordance with an embodiment of the present invention.
FIG. 6C illustrates yet another type of terminal connection for a GasP module with a time separation of two gate delays between firings of modules in accordance with an embodiment of the present invention.
Figure 7A:
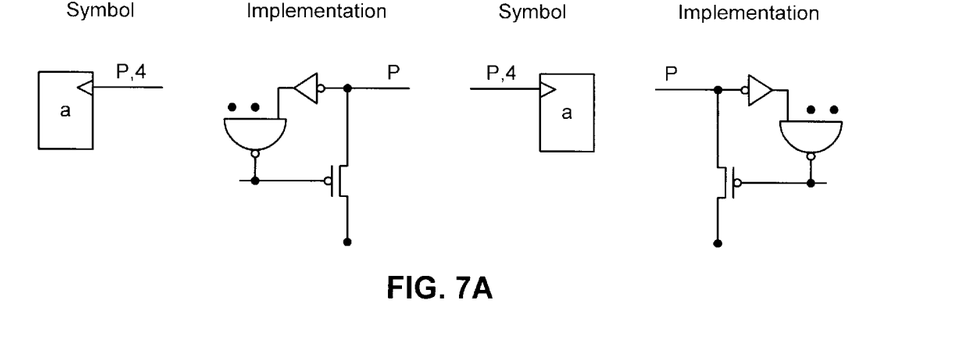
FIG. 7A illustrates a type of terminal connection for a GasP module with a time separation of four gate delays between firings of modules in accordance with an embodiment of the present invention.
Figure 7B:
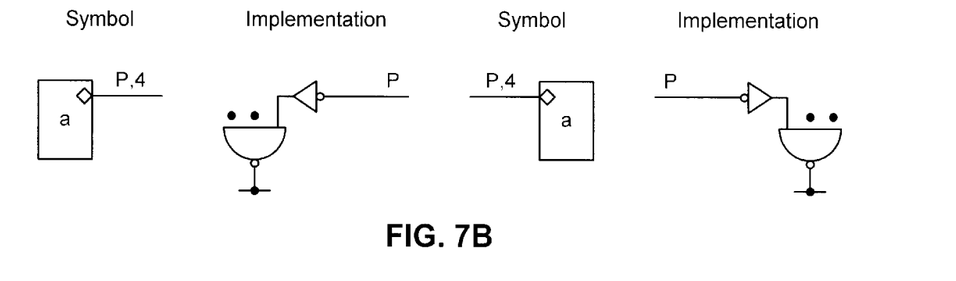
FIG. 7B illustrates another type of terminal connection for a GasP module with a time separation of four gate delays between firings of modules in accordance with an embodiment of the present invention.
Figure 7C:
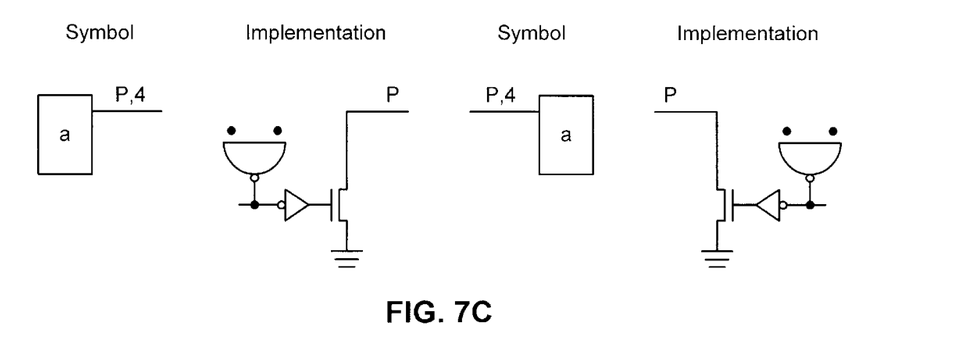
FIG. 7C illustrates yet another type of terminal connection for a GasP module with a time separation of four gate delays between firings of modules in accordance with an embodiment of the present invention.

We denote a GasP module by means of a rectangular box with a label inside and a series of connections. The label denotes the event that is associated with the GasP module. Each GasP module can have three different types of connections. FIGS. 6 and 7 give the three types of connections of a GasP module together with their 2–4 GasP implementations. FIG. 6 shows the symbols and their implementations for connections between GasP modules where the time separation between the "firings" of two modules is two gate delays. FIG. 7 shows the symbols and their implementations for connections between GasP modules where the time separation between the "firings" of two modules is four gate delays. Both figures show connections attached to the left and the right of a GasP module. Apart from a reflection, the implementations of the left-side and right-side connections are the same.

FIG. 6A shows a GasP module with a so-called self-resetting input. FIG. 6B shows a GasP module with a so-called non-resetting input. FIG. 6C shows a GasP module with an output. Common in all GasP module implementations is a NAND gate. To complete the GasP Module implementation, circuitry is added to the NAND gate for each connection. When all inputs of a GasP module are set, which means HI in the implementations of FIGS. 6A and 6B, the NAND gate will eventually "fire," i.e., go LO. The firing of the NAND gate defines the occurrence of the event. After the NAND gate fires, a pull-down transistor resets each self-resetting input. The non-resetting input has no reset capability. When the NAND gate fires, the pull-up transistor sets the output.

FIG. 7 illustrates the same ideas as in FIG. 6, except that now "setting" and "resetting" are implemented differently. Here, an input is set when the input is LO. Thus, resetting an input happens by means of a pull-up transistor, and setting an output happens by means of a pull-down transistor.

Each connection is implemented as a tri-state wire with a keeper. A tristate wire is a wire that is either "driven HI", "driven LO", or "not driven." To avoid clutter, connections in schematics appear as lines between GasP modules, and keepers are not shown. When a connection is driven HI or LO, the connection will be driven for a short period only, a period that is long enough to set the keeper and wire HI or LO. The keeper will then keep the state of the connection when the wire is not driven. Using the GasP implementations of FIGS. 6 and 7, the period that a wire is driven is about three gate delays. Notice that each pull-down or pull-up transistor conducts for a period of about three gate delays.

In order for these implementations to work properly, all transistors must be properly sized. Here, this means that all gates must have the same step-up ratio, i.e., the ratio between each gate's drive strength and output load is the same. When properly sized, each gate has about the same delay, and thus we can justifiably speak about units of delay between any two events.

Figure 8A:
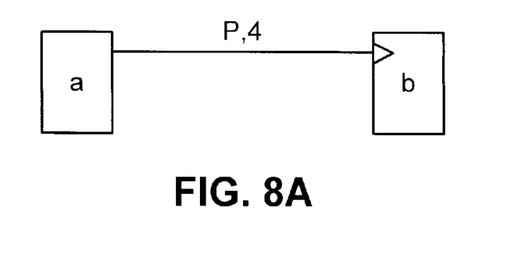
FIG. 8A is a symbolic representation of a connection between GasP modules with a delay of four units between two events in accordance with an embodiment of the present invention.
Figure 8B:
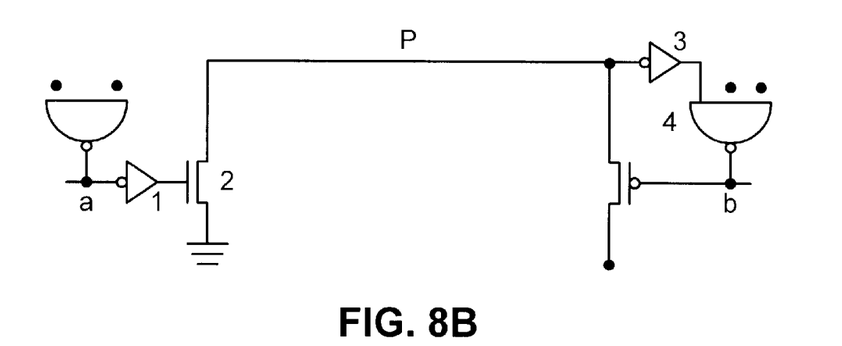
FIG. 8B illustrates corresponding circuitry for a connection between GasP modules with a delay of four units between two events in accordance with an embodiment of the present invention.
Figure 8C:
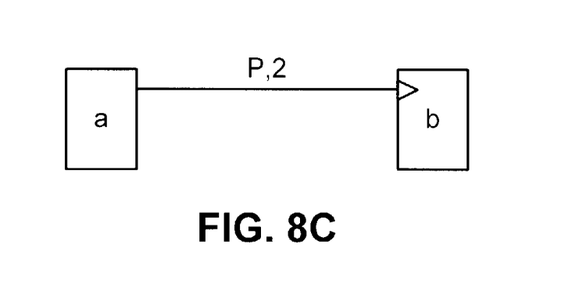
FIG. 8C is a symbolic representation of a connection between GasP modules with a delay of two units between two events in accordance with an embodiment of the present invention.
Figure 8D:
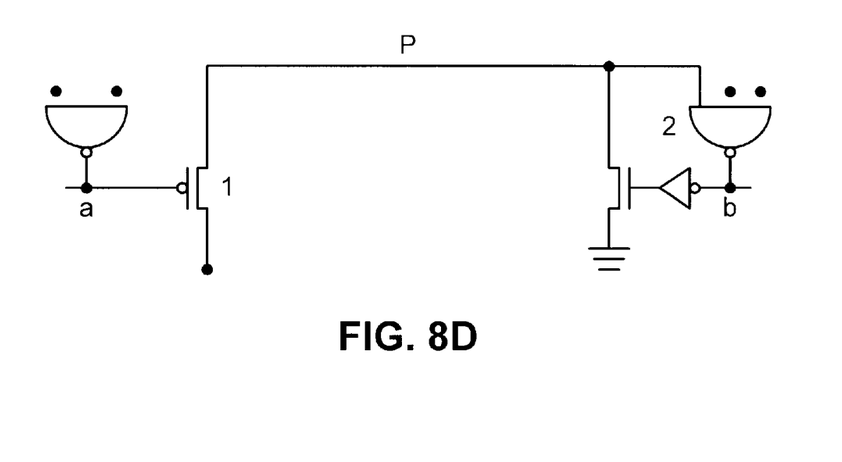
FIG. 8D illustrates corresponding circuitry for a connection between GasP modules with a delay of two units between two events in accordance with an embodiment of the present invention.

The label P on the connections to the GasP modules in FIGS. 6 and 7 gives a name to the connections and is often associated with the name of the state to which the connection corresponds. The labels 2 and 4 indicate whether the implementation of the connection must realize a time separation of two or four gate delays, respectively, between firings of successive GasP modules. FIG. 8 illustrates this idea. FIG. 8A shows a simple connection between GasP modules and FIG. 8B shows its implementation. The label 4 indicates that the connection must realize time separation of four gate delays between the firings of modules a and b. Notice that between node a going LO and node b going LO in FIG. 8B there are four gate delays. Similar remarks can be made for FIGS. 8C and 8D, where the label 2 denotes a time separation of two gate delays. The labels 2 and 4 will come in handy later when we want to calculate cycle times in GasP networks.

In an implementation we indicate the initial state of each connection by darkening the arrowheads or diamonds inside the modules that are associated with the connection. A connection with a darkened arrowhead or diamond is initially set, that is, the connection is initialized HI when the connection has the label 2 and initialized LO when the connection has the label 4.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A domino logic circuit that operates asynchronously, comprising:
    a number of stages containing domino logic, including a present stage that receives one or more inputs from a prior stage and generates one or more outputs for a next stage; and
    a control circuit for the present stage that is configured to ensure that the present stage enters a precharging state before entering a subsequent evaluation state in which one or more inputs of the present stage are used to generate one or more outputs;
    wherein the control circuit receives a prior control signal from the prior stage and sends a present control signal to the next stage;
    wherein the control circuit for the present stage is implemented using a GasP module;
    wherein the GasP module fires when inputs to the GasP module are set; and
    wherein the GasP module firing causes outputs of the GasP module to be set and causes inputs to the GasP module to be reset.

2. The domino logic circuit of claim 1,
    wherein the prior control signal indicates that the prior stage is in an evaluation state in which the prior stage generates at least one output for the present stage; and
    wherein upon receiving the prior control signal, the control circuit for the present stage is configured to,
        set the present control signal so that domino logic within the present stage enters the evaluation state, causing domino logic within the present stage to evaluate at least one input received from the prior stage to produce at least one output for the next stage, and to
        reset the prior control signal, so that domino logic within the prior stage returns to a precharging state, whereby the domino logic within the prior stage precharges before entering a subsequent evaluation state.

3. The domino logic circuit of claim 1,
    wherein if at least two stages follow the present stage, the present stage is configured to wait to enter the evaluation state until a feedback signal is received from a stage following the next stage;
    wherein the feedback signal indicates that the stage following the next stage has entered an evaluation state, which causes the next stage to enter the precharging state;
    whereby the next stage precharges before entering a subsequent evaluation state.

4. The domino logic circuit of claim 1, further comprising a keeper circuit that is configured to maintain an existing value on an output of the present stage while the present stage enters the evaluation state.

5. The domino logic circuit of claim 1, wherein domino logic circuitry for the present stage includes:
    a pulldown transistor for pulling an internal node of the present stage to a low voltage during the evaluation state; and
    a pullup transistor for pulling the internal node of the present stage to a precharge voltage during the precharging state.

6. The domino logic circuit of claim 1,
    wherein a first stage receives one or more inputs from circuitry that does not contain domino logic; and
    wherein a control circuit for the first stage causes the first stage to automatically leave the evaluation state after a fixed period of time to enter a hold state;
    wherein during the hold state inputs to the first stage cannot corrupt data within domino logic in the first stage.

7. The domino logic circuit of claim 1, wherein the cycle time between successive evaluation states is six gate delays.

8. A domino logic circuit that operates asynchronously, comprising:
    a number of stages containing domino logic, including a present stage that receives one or more inputs from a prior stage and generates one or more outputs for a next stage; and
    a control circuit for the present stage that is configured to ensure that the present stage enters a precharging state before entering a subsequent evaluation state in which one or more inputs of the present stage are used to generate one or more outputs;
    wherein the control circuit for the present stage is implemented using a GasP module;
    wherein the GasP module fires when inputs to the GasP module are set;
    wherein the GasP module firing causes outputs of the GasP module to be set and causes inputs to the GasP module to be reset;
    wherein the control circuit receives a prior control signal from the prior stage and sends a present control signal to the next stage;
    wherein the prior control signal indicates that the prior stage is in an evaluation state in which the prior stage generates at least one output for the present stage; and wherein upon receiving the prior control signal, the control circuit for the present stage is configured to,
set the present control signal so that domino logic within the present stage enters the evaluation state, causing domino logic within the present stage to evaluate at least one input received from the prior stage to produce at least one output for the next stage, and to
reset the prior control signal, so that domino logic within the prior stage returns to a precharging state, whereby domino logic within the prior stage precharges before entering a subsequent evaluation state.

9. The domino logic circuit of claim 8,
wherein if at least two stages follow the present stage, the present stage is configured to wait to enter an evaluation state until a feedback signal is received from a stage following the next stage;
wherein the feedback signal indicates that the stage following the next stage has entered the evaluation state, which causes the next stage to enter the precharging state;
whereby the next stage precharges before entering a subsequent evaluation state.

10. The domino logic circuit of claim 8, further comprising a keeper circuit that is configured to maintain an existing value on an output of the present stage while the present stage enters the evaluation state.

11. The domino logic circuit of claim 8, wherein domino logic circuitry for the present stage includes:
a pulldown transistor for pulling an internal node of the present stage to a low voltage during the evaluation state; and
a pullup transistor for pulling the internal node of the present stage to a precharge voltage during the precharging state.

12. The domino logic circuit of claim 8,
wherein a first stage receives one or more inputs from circuitry that does not contain domino logic; and
wherein the control circuit for the first stage causes the first stage to automatically leave the evaluation state after a fixed period of time to enter a hold state;
wherein during the hold state inputs to the first stage cannot corrupt data within domino logic in the first stage.

13. The domino logic circuit of claim 8, wherein the cycle time between successive evaluation states is six gate delays.

14. A computer system including domino logic circuitry that operates asynchronously, comprising:
a processor;
a main memory;
a number of stages containing domino logic, including a present stage that receives one or more inputs from a prior stage and generates one or more outputs for a next stage; and
a control circuit for the present stage that is configured to ensure that the present stage enters a precharging state before entering a subsequent evaluation state in which one or more inputs of the present stage are used to generate one or more outputs;
wherein the control circuit receives a prior control signal from the prior stage and sends a present control signal to the next stage;
wherein the control circuit for the present stage is implemented using a GasP module;
wherein the GasP module fires when inputs to the GasP module are set; and
wherein the GasP module firing causes outputs of the GasP module to be set and causes inputs to the GasP module to be reset.

15. A method for asynchronously controlling a number of stages of domino logic gates, comprising:
receiving a prior control signal from a prior stage indicating that the prior stage is in an evaluation state in which the prior stage generates at least one output for a present stage; and
in response to the prior control signal, causing the present stage to enter the evaluation state by,
setting a present control signal so that domino logic within the present stage enters the evaluation state, causing domino logic within the present stage to evaluate at least one input received from the prior stage to produce at least one output for a next stage, and
resetting the prior control signal, so that domino logic within the prior stage returns to a precharging state, whereby the domino logic within the prior stage precharges before entering a subsequent evaluation state;
wherein an asynchronous control circuit for the present stage is implemented using a GasP module;
wherein the GasP module fires when inputs to the GasP module are set; and
wherein the GasP module firing causes outputs of the GasP module to be set and causes inputs to the GasP module to be reset.

16. The method of claim 15,
wherein if at least two stages follow the present stage, the present stage waits to enter the evaluation state until a feedback signal is received from a stage following the next stage;
wherein the feedback signal indicates that the stage following the next stage has entered the evaluation state, which causes the next stage to enter a precharging state;
whereby the next stage precharges before entering a subsequent evaluation state.

17. The method of claim 15, wherein while the present stage enters a precharging state, the method further comprises using a keeper circuit to maintain an existing value on an output from the present stage to the next stage.

18. The method of claim 15, wherein the domino logic for the present stage includes:
a pulldown transistor for pulling an internal node of the present stage to a low voltage during the evaluation state; and
a pullup transistor for pulling the internal node of the present stage to a precharge voltage during the precharging state.

19. The method of claim 15,
wherein a first stage receives one or more inputs from circuitry that does not contain domino logic;
wherein the method further comprises causing the first stage to automatically leave the evaluation state after a fixed period of time to enter a hold state; and
wherein during the hold state inputs to the first stage cannot corrupt data within domino logic in the first stage.

20. The method of claim 15, wherein the cycle time between successive evaluation states is six gate delays.

* * * * *